United States Patent [19]
Keren

[11] Patent Number: 5,198,768
[45] Date of Patent: Mar. 30, 1993

[54] QUADRATURE SURFACE COIL ARRAY

[75] Inventor: Hanan Keren, Kfar Saba, Israel

[73] Assignee: Elscint, Ltd., Haifa, Israel

[21] Appl. No.: 587,447

[22] Filed: Sep. 25, 1990

[30] Foreign Application Priority Data

Sep. 27, 1989 [IL] Israel ..................................... 091805

[51] Int. Cl.$^5$ ............................................. G01V 3/00
[52] U.S. Cl. ..................................... 324/318; 324/322; 128/653.5
[58] Field of Search ................ 324/300, 307, 309, 318, 324/322; 128/653 SC

[56] References Cited

U.S. PATENT DOCUMENTS

| | | | |
|---|---|---|---|
| 4,791,371 | 12/1988 | Krol | 324/318 |
| 4,812,761 | 3/1982 | Vaughan, Jr. | 324/318 |
| 4,825,162 | 4/1989 | Roemer et al. | 324/318 |
| 4,906,933 | 3/1990 | Keren | 324/318 |
| 4,947,121 | 8/1990 | Hayes | 324/318 |
| 4,973,908 | 11/1990 | Bottomley et al. | 324/318 |

OTHER PUBLICATIONS

P. B. Roemer et al., "Simultaneous Multiple Surface Coil NMR Imaging", Society of Magnetic Resonance in Medicine, vol. 2-Abstracts Aug. 20-26, 1988, p. 875.

*Primary Examiner*—Louis Arana
*Attorney, Agent, or Firm*—Sandler, Greenblum & Bernstein

[57] ABSTRACT

A quadrature surface coil array comprising a plurality of single loop surface coils interspersed with a plurality of adjacent double loop surface coils, at least some of said surface coils overlapping the ends of adjacent surface coils and said double loop surface coils having the two loops in series to support only a single current mode thereby inhibiting cross coupling including next nearest neighbor cross coupling.

9 Claims, 2 Drawing Sheets

QUADRATURE SURFACE COIL ARRAY

FIELD OF THE INVENTION

This invention is concerned with magnetic resonance imaging (MRI) or magnetic resonance spectroscopic (MRS) systems and more particularly with surface coils used in such systems.

BACKGROUND OF THE INVENTION

Magnetic resonance systems acquire data using strong magnets for providing large static magnetic fields. Gradient coils within the magnets are provided to "focus" the magnetic fields. The large static magnetic fields are used to magnetically align certain nuclei ("spins") of the sample being imaged or spectroscopically studied. A radio frequency (RF) pulse is used to "tip" the aligned spins so at least a projection of the tipped spins is in a plane orthogonal to the plane in which the spins are aligned. When the RF pulse terminates the nutated or tipped spins tend to dephase and also tend to return to the aligned condition. The movement of the spins in the orthogonal plane generate what are known as "free induction decay" (FID) signals. It is the FID signals in one form or another that are used for imaging and/or spectroscopic purposes.

While many types of magnets can be used to generate the large static magnetic fields: in a preferred embodiment a super-conducting magnet is used. The subject or patient is placed in the bore of the super-conducting magnet for exposure to the large static magnetic field.

Radio frequency coils or probes are used for transmitting RF pulses and/or receiving the FID signals. These probes are energized in a transmitting state with an RF pulse frequency known as the Larmor frequency which, as is well known, is a function of the particular element and the strength of the magnetic field in which the element is located. The Larmor frequency is also the precessional angular frequency of the aligned nuclei (spins) and the frequency of the FID signals.

The RF probes are either body probes wound around the base of the large magnet or special probes often used in addition to the body probes. The special probes are designed to be juxtaposed to particular portions of the body such as spine, limbs or the head. The probes must be capable of:

resonating at the desired radio frequency;

generating homogeneous magnetic field when the probe is used in the transmitting mode, and adding only minimal noise to the signals received.

Surface coils are such special probes designed to be juxtaposed to particular portions of the body. Surface coils are relatively efficient due to the proximity of the probe to the body part from which data is acquired.

Notwithstanding the relative high efficiency of the proximate probes including surface coils; the signal-to-noise ratio (SNR) of the acquired data remains critical because of the small amplitudes of the FID signals. The SNR decreases because, among other things, "pick up" of stray signals by the probe caused by stray capacitances and/or mutual inductance between the coils in quadrature surface coil arrangements or in surface coil arrays. SNR is also decreased because of variations in the impedances of the probes when "loaded" by the patient. Different patients have different body impedances and, therefore, load the RF probes differently. Also, the human body is not symmetrical—thus, loading is not symmetrical and asymmetrical loading results in variations in the signals received from the probe. Signal-to-noise ratio is adversely affected by the size of the surface coil; so that when other things are equal the larger the surface coil, the smaller the signal-to-noise ratio.

Another serious problem faced by scientists and designers of MR systems is that the RF power transmitted by the probes may cause heating of the body sections being studied. The heating occurs because only a relatively small portion of the RF power tips the spins; most of the power generates eddy and dialectric currents in the tissue of the subject which in turn generate heat. This RF heating has caused the Federal Drug Administration (FDA) in the United States to set a limit on the specific power absorption rate (SAR) of the RF signal that can be used in imaging humans. The set limit is 0.4 Watts per kilogram. Thus, there is a limit on the power that can be used by RF probes. This limit is a fraction of the patient's weight. The limit is designed to safeguard the patient from exposure to RF caused heat damage to tissues.

Most probes used in the past have been linearly polarized. For example, "saddle" shaped coils have been extensively used. Linear polarized as used herein means that the field provided by the probes are normal and remain normal to one of the planes defined by two of the orthogonal axes of the MR system, generally speaking the MR systems are considered as XYZ orthogonal systems with the large static magnetic field in the Z direction. The spins precess around the Z axis, for example, and the effect of a projection of linear polarization is in the XY plane.

When using the linear polarization of the applied RF pulses, only half of the RF pulse power of the generated magnetic lines pass through the subject. Accordingly, only half of the RF power is effectively used, at best, to tip the spins. Another problem is that the presently available RF probes, including surface coils, cause what are known as radio frequency penetration artifacts which appear on the body images as shaded areas. The artifacts result from standing waves of the RF radiation passing through the tissue at high frequencies which distort the uniformity of the applied radio frequency magnetic field. In an attempt to overcome this problem, the prior art implemented an excitation mode wherein the polarization is circular rather than linear. See, for example, the Patent Application entitled "Quadrature Surface Coil" filed in the United States on Mar. 10, 1989, which received Ser. No. 321,885 and the references cited in that Patent Application. The invention of that Patent Application was invented by the inventor of the present Application and is assigned to the Assignee of the present Application.

The circular polarization in addition to improving image quality reduces the power required to achieve the given shift of the spins. The circular polarization decreases the necessary RF power by a factor of two. Accordingly, smaller RF power amplifiers can be used.

Also, less energy is absorbed by the patient; thereby reducing the problem of possibly exceeding the 0.4 Watts per kilogram SAR. The sensitivity of the receiver coils to the FID signals are also greater with circular polarization by an amount that increases the signal-to-noise ratio by a factor of the square root of 2.

A problem occurring when using quadrature mode equipment has been the difficulty in providing coils which can generate circularly polarized RF fields without being unduly influenced by the patient loading. Also, quadrature mode generating equipment is generally unduly influenced by the cross-coupling; i.e., the mutual inductance between multiple coils that must be used to generate the circular polarization. Therefore, a particularly aggravating problem is the minimization of the cross-coupling between the multiple coils.

The prior art attempts at accomplishing circular polarization or quadrature excitation have been accomplished using multiple spaced-apart coils. The multiple spaced-apart coils comprise, for example, either two coils physically at 90° to each other, counter rotating quadrature current resonators, planar pair resonators or extremely complicated quadrature surface coils.

Another problem related to the use of quadrature surface coils is that none of the known quadrature surface coils developed by others can be effectively used for imaging the spine. For example, when two separate coils, 90° to each other are used; then, only one of the coils can be placed proximate to the spine while the other coil is kept away from the spine by the subject's body. The distance from the subject's body in effect makes a second coil irrelevant to the imaging process. Thus, until the invention of the previously mentioned quadrature surface coil provided by the inventor herein, none of the available planar pair resonators, counterrotating quadrature current resonators or the quadrature surface coils were conducive to use in spinal imaging.

A problem with the previously mentioned quadrature surface coil invention is the previously mentioned problem, that the SNR signal is adversely related to the size of the coil. Thus, to make the surface coil sufficiently large to image the spine at one sitting results in a signal-to-noise ratio that is much too low for practical use. Therefore, when using the previously mentioned quadrature surface coils, it is necessary to take a plurality of acquisitions to image the entire spine. Apparatus for making such a plurality of acquisitions is described in U.S. Pat. No. 4,791,371, which issued on Dec. 13, 1988.

An array of surface coils for use in imaging a spine is taught in an abstract entitled "Simultaneous Multiple Surface Coil NMRI Imaging" by P. B. Roemer et al which appeared in the Book of Abstracts, Vol. 2 of the Society of Magnetic Resonance in Medicine at the Seventh Annual Meeting and Exhibition held on Aug. 20–26, 1988, in San Francisco. The same array is described in U.S. Pat. No. 4,825,162 which issued on Apr. 25, 1989. In that abstract and in the patent an array of coils is described wherein the adjacent coils overlap to prevent nearest neighbor interaction (cross coupling). The interaction between the next nearest neighbor is allegedly reduced by connection of each coil of the array to low input impedance (about 5 ohms) preamplifiers.

The problem with this solution is, among other things, the use of preamplifiers with low input impedance. Such low input impedance amplifiers are not standard and, therefore, are costlier. Also, the normal input impedance of the amplifiers is 50 ohms. By using amplifiers with input impedance of 50 ohms and less, a serious impedance matching problem is created.

BRIEF DESCRIPTION OF THE INVENTION

Accordingly, it is an object of the present invention to provide a surface coil that inhibits cross-coupling with other coils.

A related object of the present invention is to use the cross-coupling inhibiting surface coil to provide means for inhibiting the mutual inductance between consecutive (nearest neighbor) and alternate (next nearest neighbor) surface coils in a seriate array of surface coils.

Another related object of the present invention is to use the cross-coupling inhibiting surface coil in a quadrature surface coil arrangement.

A more particular object of the present invention is to provide coils ostensibly having a pair of loops, but having only one current mode.

A related particular object of the present invention is to connect each loop of the pair of loops in series with the other loop to minimize, if not eliminate, cross-coupling with other coils in the system with the coils having the pair of serially connected loops.

A further object of the present invention is to provide a surface coil array that can be used for imaging virtually the entire spine of a patient without having to move the patient or the surface coil and still avoiding the problems arising from mutual inductance between the individual surface coils of the array of surface coils.

In accordance with a preferred embodiment of the present invention, a cross-coupling inhibiting surface coil is provided, said cross-coupling inhibiting surface coil comprising:

a pair of loops and means for serially connecting said pair of loops whereby said pair of loops have only one current mode.

In accordance with another aspect of the present invention said cross-coupling inhibiting surface coil comprises a first pair of spaced-apart conductors parallel to each other, a second pair of spaced apart oppositely disposed conductors parallel to each other, being transverse to and connected to one of said first pair of conductors, a third pair of spaced apart oppositely disposed conductors parallel to each other, being transverse to and connected to the other of said first pair of conductors, and a fourth pair of conductors, each conductor of said fourth pair connecting one conductor of said second pair to an oppositely disposed conductor of said third pair.

In accordance with another embodiment of the present invention, a surface coil array is provided including at least one cross-coupling inhibiting surface coil in the array with each surface coil of the array physically overlapping the consecutive surface coils.

In accordance with yet another aspect of the present invention, a quadrature coil arrangement is provided including at least one cross-coupling inhibiting surface coil.

DESCRIPTION OF THE DRAWINGS

The above mentioned and other features and objects of the present invention will be best understood when considered in the light of the following description of broad aspects of the present invention made with reference to the accompanying drawings, wherein.

GENERAL DESCRIPTION

Figure 1:
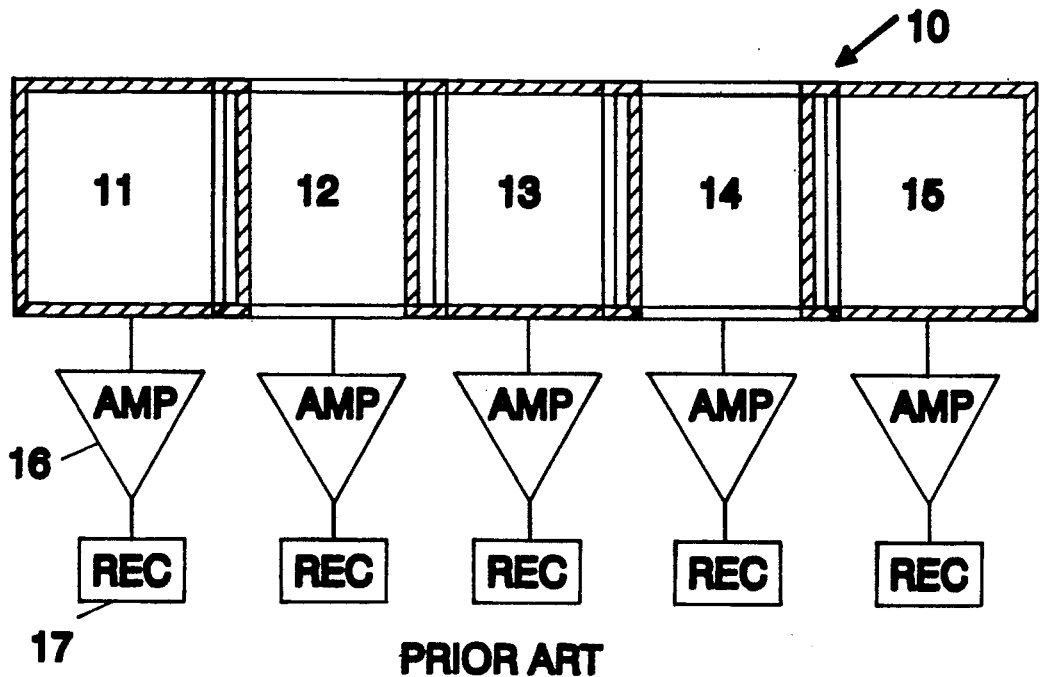
FIG. 1 is a schematic showing of prior art array of surface coils.

The surface coil arrangement 10 of FIG. 1 shows a first surface coil 11 in an array of surface coils comprising surface coils 11, 12, 13, 14 and 15. The surface coils are in an overlapping relationship to minimize mutual inductance occurring between the consecutive surface coils. Each of the surface coils is coupled to a preamplifier, such as preamplifier 16 connected to surface coil 11. Each of the preamplifiers is connected to a receiver, such as receiver 17 connected to the preamplifier 16.

In a preferred embodiment the overlapping area comprises about 17% of the area of one of the consecutive coils. Notwithstanding the fact that the overlapping virtually eliminates any problems caused by mutual inductance between consecutive coils, there is still the problem of mutual inductance between alternate coils, such as coils 11 and 13, 12 and 14 and 13 and 15. The mutual inductance caused between coils that are further away than just alternate coils is de minimis.

Figure 2:
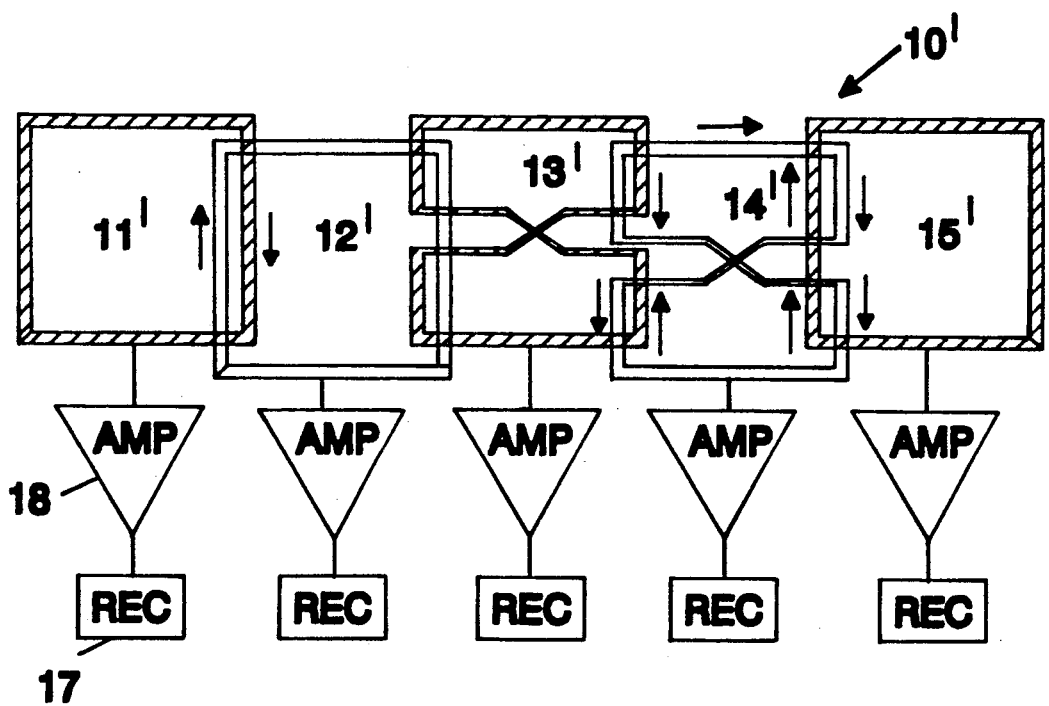
FIG. 2 is a schematic showing of the present surface coils array including two cross-coupling inhibiting coils.

FIG. 2 shows a unique method of overcoming the cross-coupling of mutual inductance due to current flow in the next nearest neighbor. The cross-coupling between the nearest neighbor is overcome by overlapping the surface coils, as shown in FIG. 1. Thus, coupling between surface coils 11' and 13' in FIG. 2 is overcome by using a cross-coupling inhibiting coil for surface coil 13'. Cross-coupling between surface coil 12' and 14' is overcome when coil 14' is a cross-coupling inhibiting type coil.

Similarly, there is no cross-coupling between the next nearest neighbor's coils 13' and 15'. The amplifiers such as amplifier 18 extending from each of the surface coils is a normal impedance amplifier not a low impedance amplifier. Thus, the amplifier such amplifier 18 going to the receiver 17 is the normal 50 ohm amplifier thereby precluding matching problems and the cost and expense of obtaining special amplifiers.

Figure 3A:
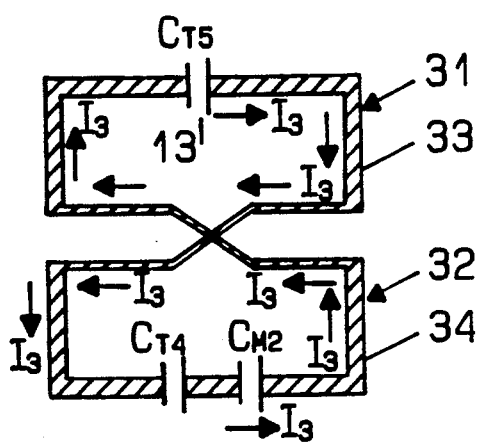
FIG. 3a is a schematic showing the inventive two loop cross-coupling inhibiting coil, FIG. 3b schematically shows a prior art three loop, two mode surface coil.
Figure 3B:
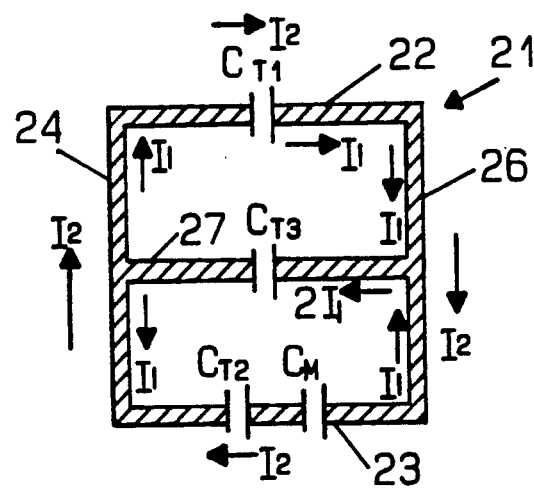

The cross-coupling inhibiting coil, such as coil 13' is compared to a normal dual-mode coil shown in FIG. 3b as coil 21. Coil 21 comprises a loop made out of conductors 22 and 23 coupled together by spaced-apart parallel transverse conductors 24 and 26. The single loop is traversed by a current I2 governed by the impedance comprised of the inductance of conductors 22, 23, 24, and 26 in combination with the capacitance of capacitors CT1 and CT2. The capacitor CM is the matching capacitor used to match the coil to the external circuit.

The single loop is also split into two individual loops by conductor 27 which is spaced apart from and parallel to conductors 22 and 23 and is connected to the two transverse conductors 24 and 26. The conductor 27 include the capacitance CT3. The two loops are traversed by currents I1. A first current I1 passes through conductors 22, the top part of conductor 26 through conductor 27 and through the top part of conductor 24. A second current I1 passes through the bottom part of conductor 24, conductor 23, the bottom part of conductor 26 and through conductor 27. Thus, conductor 27 has current of 2I1 passing therethrough. The current I1 is a result of the impedance due to the inductance and the capacitance of the two described loops.

Thus, a dual mode of current flows in the coil 21. In contrast thereto, the coil 13' has only one mode of current and that is I3. The current in loops 31 and 32 of coil 13' are in series and only one current can pass therethrough.

The loop 32 is shown as containing a tuning capacitor CT4 and a matching capacitor CM2. Only one tuning capacitor is shown since coil 13' has only one current mode. Coils such as coil 21 are noisier than coil 13' because they pick up signals in each of the tuned loops; i.e., I2 and I1 portions whereas coil 13' only has one tuned frequency and, therefore, tends to pick up less noise.

Coil 13' also inhibits cross-coupling. For example, if there is an inductive coil in the vicinity of conductors 33 and 34, the current induced in each of those conductors according to Lenz's Law would be in opposite directions so that the induced currents would cancel each other out thereby inhibiting cross-coupling or mutually induced signals in the coil.

FIG. 2 shows a use of the cross-coupling inhibiting coil in an array of coils that would be especially useful, for example, for acquiring data on a patient's spine. The total coil 10' can be made sufficiently long to image a spine without having to move either the coil or the patient for the imaging process and has comparatively low noise output. There is a minimum of coupling between adjacent coils and a minimum of coupling between the next nearest coils. At the same time the amplifiers used to receive the signals from the surface coil array are regular amplifiers; i.e., 50 ohm input amplifiers thereby precluding the necessity of having to acquire special low input impedance amplifiers and the impedance matching problems that go with such special amplifiers.

Figure 4:
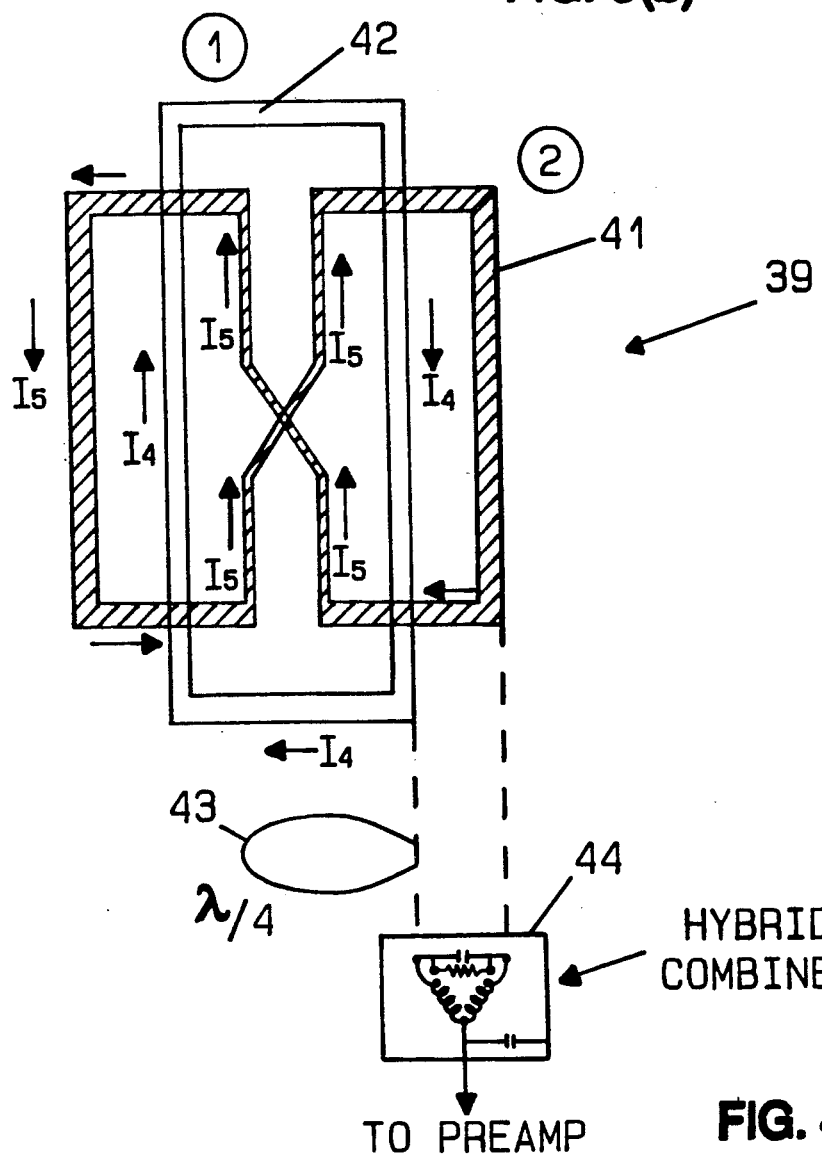
FIG. 4 is a schematic showing of a quadrature surface arrangment using the cross-coupling inhibiting surface coil.

Another use of the cross-coupling inhibiting coil such as coils 13' and 14' is shown in FIG. 4. In FIG. 4, a cross-coupling inhibiting coil 41 is shown as an integral part of a quadrature surface coil arrangement. The surface coil arrangement also includes coil 42. Coil 42 is a normal rectangularly shaped coil.

One of the problems normally faced by quadrature surface coils is the cross-coupling between the different quadrature components, such as between coils 41 and 42 of the quadrature surface coil 39 shown in FIG. 4. The qudrature surface coil arrangment of FIG. 4 also includes a quarter wavelength section 43 and a hybrid combiner section 44. The operation of these sections is explained in the Patent Application referred to earlier herein entitled "Quadrature Surface Coil", U.S. Ser. No. 321,885. Coil 42 is shown as having a current I4 flowing therethrough. Coil 41 is shown having current I5 flowing therethrough. Note that any current induced in coil 41 due to the coil current in coil 42 tends to cancel itself out thus overcoming the problem of cross-coupling between quadrature coils in a quadrature surface coil.

Thus, precise uses are shown of a cross-coupling inhibiting coil in magnetic resonance systems. A surface coil array, for example, is provided that is ideal for imaging the spinal column of a patient without having to move the patient or the coil array, and nonetheless has a signal-to-noise ratio of a relatively small surface coil. The system does not require special low impedance amplifiers and/or special impedance matching circuitry. A quadrature surface coil arrangement utilizing the cross-coupling inhibiting coil prevents cross-coupling between the different coils.

While the invention has been described with reference to certain embodiments, it should be understood that the description is made by way of example only, and not as a limitation on the scope of the invention.

What is claimed is:

1. A surface coil array comprising:
   a plurality of adjacent surface coils,
   said array extending in a first direction,
   said surface coils including:
   single loop surface coils,
   double loop surface coils,
   means for inhibiting cross-coupling between nearest neighbor coils,
   means for inhibiting cross-coupling between next nearest neighbor coils,
   said means for inhibiting cross-coupling between nearest neighbor surface coils comprising overlapping the ends in said first direction of said adjacent ones of said surface coils,
   said means for inhibiting cross-coupling between next nearest neighbor surface coils comprising said double loop surface coils wherein the two loops of said double loop surface coils are in series so as to support only a single current mode.

2. A surface coil array comprising:
   at least four adjacent surface coils extending in a first direction,
   a first of said four surface coils being a single loop surface coil,
   a second and third surface coil being two-loop surface coils said loops support only a single current mode to inhibit cross-coupling including next nearest neighbor cross-coupling,
   said fourth surface coil being a single loop surface coil, and
   all of said surface coils overlapping the adjacent surface coil in said first direction to inhibit nearest neighbor cross-coupling.

3. The surface coil array of claim 2 wherein said single loop surface coils are rectangularly shaped surface coils.

4. The surface coil array of claim 2 wherein the two loops of the two loop surface coils extend in a direction normal to the longitudinal direction of the array.

5. The surface coil array of claim 2 wherein the two loops are each overlapped by the preceding coil.

6. A quadrature surface coil arrangement for use in magnetic resonance (MR) systems, said surface coil arrangement comprising:
   a first coil for generating a circular magnetic field responsive to currents generated in the first coil means by free induction decay (FID) signals in the MR system,
   a second coil proximate to said first coil,
   said first coil extending beyond said second coil in a first direction and said second coil extending beyond said first coil in a second direction orthogonal to said first direction,
   said second coil producing a magnetic field lying normal to the plane of the second coil at the center of the second coil responsive to FID signals in the MR system, and
   said first coil being a cross-coupling inhibiting coil comprising a first loop and a second loop, and
   means for electrically coupling said first and second loop in series to inhibit cross-coupling between the first loop and the second loop.

7. The quadrature surface coil arrangement of claim 6 wherein said second coil means comprises a single loop.

8. The quadrature surface coil arrangement of claim 7 including:
   means for coupling said quadrature surface coil to said MR system,
   said means for coupling to said MR system comprising:
   hybrid combiner means,
   coaxial cable means for coupling said quadrature surface coil to said hybrid combiner means.

9. The quadrature surface coil arrangment of claim 7 wherein said coaxial cable means comprises:
   first and second coaxial cables,
   one of said first and second coaxial cable means including a quarter wavelength section whereby one of said coaxial cables is longer than the other of said first and second coaxial cables by approximately a quarter wavelength.

* * * * *